(12) United States Patent
Frazier

(10) Patent No.: US 6,864,816 B1
(45) Date of Patent: Mar. 8, 2005

(54) METHOD AND APPARATUS FOR HIGH-SPEED QUANTIZATION USING RESONANT TUNNELING TECHNOLOGY

(75) Inventor: Gary A. Frazier, Garland, TX (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 10/762,854

(22) Filed: Jan. 21, 2004

(51) Int. Cl.[7] .............................................. H03M 1/00
(52) U.S. Cl. ........................ 341/133; 341/155; 341/200; 326/134; 326/135; 327/195
(58) Field of Search ................................. 341/133, 155, 341/200; 326/134–135; 327/195, 196

(56) References Cited

U.S. PATENT DOCUMENTS

| | | | | |
|---|---|---|---|---|
| 5,815,008 | A | * | 9/1998 | Williamson et al. ........ 326/134 |
| 6,292,118 | B1 | * | 9/2001 | Broekaert .................... 341/133 |
| 6,348,887 | B1 | | 2/2002 | Broekaert |
| 6,362,660 | B1 | * | 3/2002 | Deng .......................... 326/134 |
| 6,366,226 | B2 | * | 4/2002 | Broekaert .................... 341/133 |
| 6,456,214 | B1 | * | 9/2002 | van der Wagt ............. 341/133 |
| 6,456,215 | B1 | * | 9/2002 | Frazier ........................ 341/133 |
| 6,509,859 | B1 | | 1/2003 | van der Wagt |

OTHER PUBLICATIONS

Richard H. Mathews, et al., "A New RTD–FET Logic Family", Proceedings of the IEEE, vol. 87, No. 4, Apr. 1999, pp. 596–605.

* cited by examiner

*Primary Examiner*—Michael Tokar
*Assistant Examiner*—Khai M. Nguyen
(74) *Attorney, Agent, or Firm*—Baker Botts L.L.P.

(57) ABSTRACT

An apparatus includes a quantizer circuit having a resonant tunneling device with an operational characteristic that includes a first region of unstable operation, and second and third regions of stable operation. An input terminal and an output terminal are each coupled to one end of the resonant tunneling device. A bias section is coupled to the resonant tunneling device, and responds to a clock signal by alternately operating in a first mode where the resonant tunneling device is forced to operate within the first region, and a second mode where the resonant tunneling device is permitted to operate in either of the second and third regions.

14 Claims, 3 Drawing Sheets

METHOD AND APPARATUS FOR HIGH-SPEED QUANTIZATION USING RESONANT TUNNELING TECHNOLOGY

BACKGROUND OF THE INVENTION

High-speed quantizer circuits, such as latching comparators, can be used to build sophisticated digital signal processing systems, including systems which digitize microwave signals. Comparators of this type convert analog signals into digital data under the action of a clock signal. Where the clock signal has a high frequency, for example from about 1 GHz up to 500 GHz or more, one known type of latching comparator has two resonant tunneling diodes (RTDs) which are coupled in series, and operate with very low power consumption. In one configuration of such a comparator, complementary versions of a single clock signal are supplied to respective ends of an arrangement that includes the two series-coupled RTDs. While this known approach has been generally adequate for its intended purposes, it has not been satisfactory in all respects.

More specifically, this approach provides good comparator sensitivity, frequency bandwidth and sampling rate, but only where the two RTDs are very closely matched in their electrical characteristics, and where there is very precise control of both the amplitude and phase of each of the complementary clock signals. A few degrees of phase mismatch in the clocks, or a few percent difference in RTD characteristics, can cause a loss in sensitivity of 10 dB, or significantly more.

SUMMARY OF THE INVENTION

From the foregoing, it may be appreciated that a need has arisen for a method and apparatus for implementing a quantizer circuit which uses a resonant tunneling device, in a manner that avoids at least some of the disadvantages of pre-existing approaches. According to the present invention, a method and apparatus are provided which address this need in the context of a quantizer circuit having a resonant tunneling device with two ends and an operational characteristic, and having an input terminal and output terminal that are each coupled to one of the ends of the resonant tunneling device. The method and apparatus involve: selectively biasing the resonant tunneling device to operate in a first operational mode in which the resonant tunneling device is forced to operate within a first region of its operational characteristic that involves unstable operation; selectively biasing the resonant tunneling device to operate in a second operational mode mutually exclusive from the first operational mode, in which the resonant tunneling device is permitted to operate in either of second and third regions of its operational characteristic that each involve stable operation; and responding to a clock signal by selectively operating the resonant tunneling device in the first and second operational modes in an alternating manner.

BRIEF DESCRIPTION OF THE DRAWINGS

A better understanding of the present invention will be realized from the detailed description which follows, taken in conjunction with the accompanying drawings, in which.

DETAILED DESCRIPTION

Figure 1:
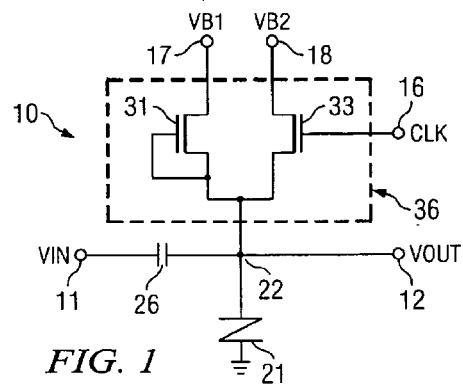
FIG. 1 is a schematic circuit diagram of an apparatus which is a latch circuit that embodies aspects of the present invention.

FIG. 1 is a schematic circuit diagram of an apparatus which is a latching comparator circuit 10 that embodies aspects of the present invention, and that is referred to herein as a latch circuit. The latch circuit 10 has an input terminal 11, to which an input voltage VIN is applied, and has an output terminal 12, at which the latch circuit 10 produces an output voltage VOUT. The latch circuit 10 has a clock terminal 16, to which a clock signal CLK is applied. For simplicity, the clock signal CLK is assumed to be a sine wave with an appropriate direct current (DC) offset, but it could alternatively have any of a variety of other waveform shapes.

The latch circuit 10 has two bias terminals 17 and 18, to which respective DC bias voltages VB1 and VB2 are applied. Although FIG. 1 shows a different bias voltage for each of the bias terminals 17 and 18, these two bias voltages could optionally be the same voltage. The latch circuit 10 includes a resonant tunneling diode (RTD) 21 of a known type, which is coupled between ground and a circuit node 22. A capacitor 26 is coupled between the input terminal 11 and the node 22. The node 22 is coupled directly to the output terminal 12. The bias voltages VB1 and VB2, the input signal VIN, the output signal VOUT and the clock signal CLK are all referenced to the common ground of the circuit.

The circuit 10 includes a field effect transistor (FET) 31, which has its drain coupled to the bias terminal 17, and its source coupled to the node 22. The gate of the FET 31 is coupled to its source. In effect, the FET 31 functions as a form of constant current source, of a type which is well known in the art. The circuit 10 also includes another FET 33, which has its drain coupled to the bias terminal 18, its source coupled to the circuit node 22, and its gate coupled to the clock terminal 16. In effect, the FET 31 serves as a voltage controlled current source, with the level of current being controlled in part by the voltage on the gate. The FETs 31 and 33 together serve as a bias section 36 of the circuit 10.

Figure 2:
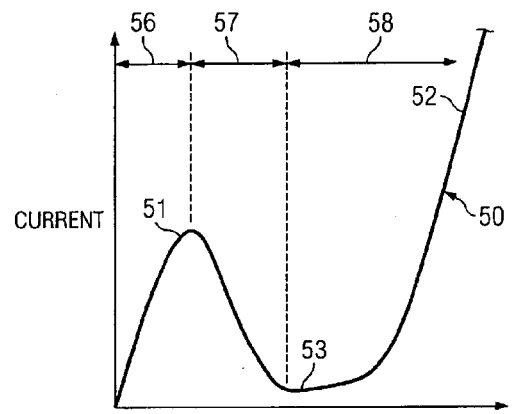
FIG. 2 is a graph showing a curve representative of a current to voltage characteristic for a resonant tunneling diode which is a component of the latch circuit of FIG. 1.

As mentioned above, the RTD 21 is a known type of device, and thus its operational characteristics are also known in the art. Nevertheless, in order to facilitate a clear understanding of the present invention, the operational characteristics of the RTD 21 are briefly discussed here. More specifically, FIG. 2 is a graph showing a curve 50 representing how the electrical current in the RTD 21 will vary in response to variation of a voltage applied across the RTD 21. It will be noted that the current has at 51 a first resonant peak, and has at 52 a further and larger resonant peak which is not visible in its entirety in FIG. 2. There is a valley 53 between the two peaks 51 and 52.

The curve 50 has regions 56 and 58 with a positive slope, which each represent a positive differential resistance of the RTD. Between the regions 56 and 58 is a region 57 where the curve 50 has a negative slope, which represents a negative differential resistance or negative conductance of the RTD. Since the regions 56 and 58 each represent a state where RTD has a positive resistance, operation within these regions is relatively stable. In contrast, since the region 57 represents a state in which the effective resistance of the RTD is negative, operation within the region 57 is potentially unstable. Thus, although the RTD 21 is in theory capable of continuous operation within the region 57 in a somewhat delicate equilibrium, real-world factors such as signal noise will tend to disrupt the ability of the RTD to maintain any such continuous operation, and will encourage the RTD to give in to its tendency to spontaneously move out of the region 57 and into either of the regions 56 and 58.

Figure 3:
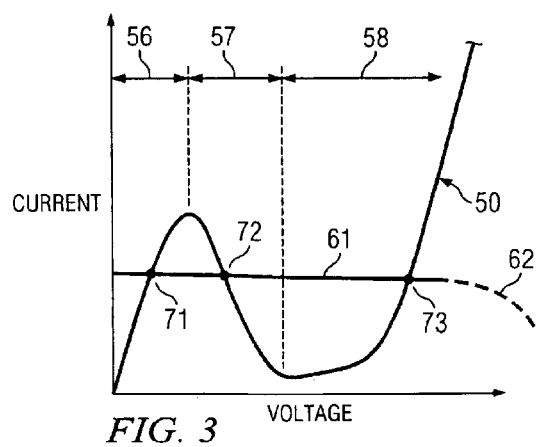
FIG. 3 is a graph similar to FIG. 2, but with the addition of a load line for a situation where an input voltage to the latch circuit of FIG. 1 is zero.

FIG. 3 is a graph which is similar to the graph of FIG. 2, but with the addition of a load line 61. The load line 61 represents an operational mode of the bias section 36 where the FET 33 has been turned off by the clock signal CLK, and thus has a very high resistance. Due to this high resistance, little or no current will flow through the FET 33. FIG. 3 also assumes that there is no input signal applied to the input terminal 11. Under these circumstances, the current flowing through the RTD 21 will essentially be the constant current flow generated by the FET 31. Consequently, the load line 61 is approximately horizontal in FIG. 3, because the current (vertical axis) remains substantially constant despite variations in voltage (horizontal axis). As a practical matter, the current through the FET 31 will actually begin to drop off at higher voltages, as indicated diagrammatically by the broken line at 62. However, this non-linear portion 62 of the load line 61 is beyond the operational region which is of interest for the purposes of the present invention. Accordingly, the load line 61 is depicted and described here as a straight line, for the purpose of simplicity and clarity in explaining the present invention.

With reference to FIG. 3, it will be noted that the load line 61 intersects the curve 50 at three points 71, 72 and 73, which are respectively located in the operational regions 56, 57 and 58. The points 71, 72 and 73 represent the three operational states which are possible for the RTD 21 when the FET 33 is turned off and when there is no input voltage at the input terminal 11. If the RTD is operating at either of the points 71 and 73, then it is operating in a stable state and will tend to remain in that state. In contrast, if the RTD is operating at the point 72, it is operating in a metastable operational state, due to the fact that the RTD 57 has a negative differential resistance within the region 57, and due to the fact that the effective resistance of the constant current load line is very high. When the RTD is operating at point 72, it will be operating in an unstable condition whenever the effective positive conductance (reciprocal resistance) of its bias circuit at point 72 is less than the magnitude of the negative conductance (reciprocal negative resistance) of the RTD at point 72.

As mentioned above, in an ideal world which is free of extraneous noise, the RTD 21 could operate indefinitely at the point 72, so long as it was not influenced by any extraneous factors such as noise. However, noise is inherent in the real world, and will tend to disrupt any equilibrium that may exist at the point 72, and thereby cause the RTD 21 to begin moving toward one of the more stable points 71 and 73. In the particular operational condition which is shown in FIG. 3, it is not possible to reliably predict whether the RTD 21 will move toward the point 71 or the point 73, because the factors such as noise which influence the RTD 21 involve a degree of randomness.

Figure 4:
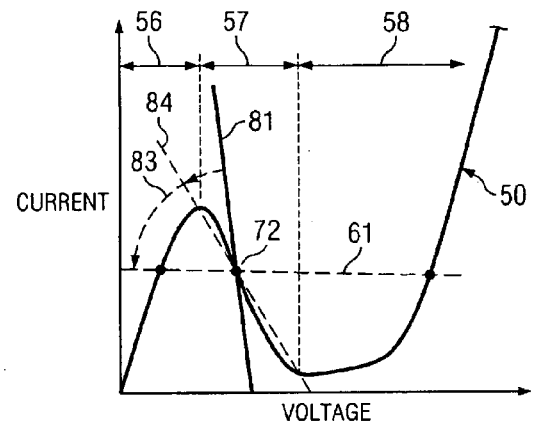
FIG. 4 is a graph similar to FIG. 3, but with the addition of a further load line.

FIG. 4 is a graph which is similar to FIG. 3, except that it includes an additional load line 81 which is approximately vertical. The load line 81 corresponds to operational conditions similar to those described above in association with FIG. 3, except that the clock signal CLK at the clock terminal 16 has changed state and turned on the FET 33, so that the FET 33 now has a low resistance and conducts current. It will be noted that the load line 81 intersects the curve 50 at only one point, which is the point 72. In this regard, the load line 81 does not actually need to intersect the curve 50 at precisely the same point 72 as the load line 61 However, for convenience and clarity in explaining the present invention, it is assumed that the circuit 10 is configured so that the load lines 61 and 81 intersect the curve 50 the same point 72.

The point 72 is in the region 57, which represents a negative differential resistance of the RTD 21. Since the load line 81 does not intersect the curve 50 at any point within either of the regions 56 and 58, the RTD 21 is forced to operate at the point 72 within the region 57 whenever the FET 33 is turned on. Due to the fact that the effective resistance of the load line 81 is relatively low, the RTD will maintain its operating point at 72. When the RTD is operating at point 72, it will be operating in a stable condition whenever the effective positive conductance (reciprocal resistance) of its bias circuit at point 72 is greater than the magnitude of the negative conductance (reciprocal negative resistance) of the RTD at point 72. Consequently, so long as the FET 33 is thus conducting, the RTD 21 does not have the option of making a transition from the point of operation 72 to a point of more stable operation within either of the regions 56 and 58. This represents the reset state of the latching comparator circuit 10.

When the clock signal CLK at the clock terminal 16 eventually turns off the FET 33, the bias section 36 will, as indicated diagrammatically at 83, make a transition over time from operation according to the load line 81 to operation according to the load line indicated at 61. This occurs very rapidly, during the time that it takes for the FET 33 to transition from its conducting state to its non-conducting state. As this transition occurs, the load line will effectively pass through a position indicated diagrammatically at 84, where the load line first intersects points outside the region 57, or in other words within each of the regions 56 and 58. Once the load line reaches this position, it will suddenly become possible for the RTD 21 to transition from unstable operation at the point 72 in region 57 to stable operation at a point within either of the regions 56 or 58.

In the preceding discussion, it has been assumed that the input voltage VIN at the input terminal 11 is a DC signal with a value of zero volts. However, it will now be assumed that an alternating current (AC) input voltage VIN is present at the input terminal 11. As discussed in more detail below, the state of this input voltage will reliably determine whether the RTD 21 transitions to the point 71, or to the point 73. Although the input signal VIN at the input terminal 11 is an AC signal, it does not actually change much in value during the very short time interval needed for the FET 33 to change from a conducting state to a non-conducting state, or in other words for a transition to occur at 83 in FIG. 4 from the load line 81 to the load line 61.

Figure 5:
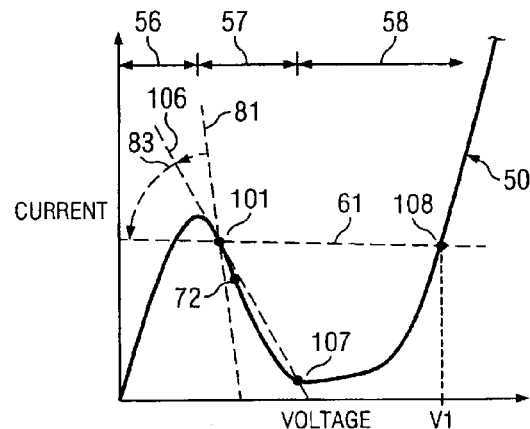
FIGS. 5 and 6 are each a graph similar to FIG. 4, but showing respective situations at points in time where the input voltage to the latch circuit of FIG. 1 is respectively positive and negative.

Assume first that, at a point in time just before the clock signal CLK causes the FET 33 to switch from a conducting state to a non-conducting state, the input voltage VIN is a positive voltage representing a binary "1". This positive input voltage VIN will effectively produce a positive current flow through the RTD 21, which supplements the constant current flow through RTD 21 that is caused by the FET 31. FIG. 5 is a graph which corresponds to this operational condition. Due to the fact that there is an increased amount of current flowing through the RTD 21, the load lines 61 and 81 pass through a point 101 which is offset upwardly along the curve 50 from the point 72.

When the FET 33 is conducting, the load line 81 is in effect, and intersects the curve 50 only at the point 101, such that the RTD 21 is forced to operate within the region 57 in an unstable mode, which represents the reset state of the latch circuit 10. When the FET 33 is then turned off and transitions from its conducting state to its non-conducting state, the associated load line transitions at 83 from the load line 81 to the load line 61.

As this occurs, the load line will conceptually reach a state 106, where it intersects the curve 50 at the point 101 within the region 57, and also at a point 107 which is just inside the region 58. However, the load line 106 has not yet transitioned far enough to intersect the curve 50 at a point within the region 56. Consequently, the RTD 21 is momentarily in a condition where it can transition from the region 57 to the region 58, but not from the region 57 to the region 56.

Therefore, the RTD 21 transitions from the point 101 to the point 107. Then, as the load lines completes its transition to the position 61, the RTD 21 moves upwardly and rightwardly along the curve 50 from the point 107 to a point 108. At the point 108, the voltage across the RTD 21 has a value of V1, which is also present at the output terminal 12, and thus serves as the output voltage VOUT of the circuit 10. This voltage VI represents a state where the circuit 10 is said to be storing a binary "1". The circuit 10 will continue to operate at the point 108 until the clock signal CLK again turns on the FET 33 in order to force the RTD 21 back into its reset condition within the region 57. Thus, the circuit 10 is said to latch the value of VIN at the clock transition time.

Figure 6:
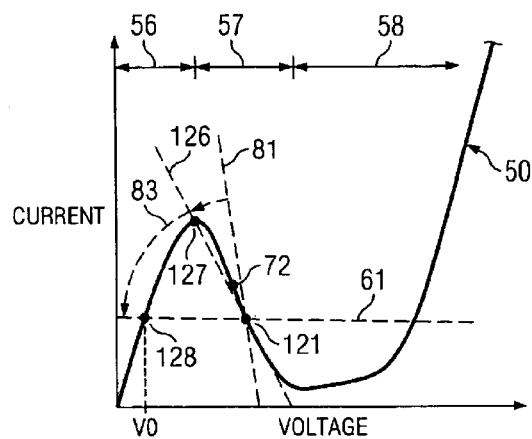

Now assume that the FET 33 is conducting and is about to change to its non-conducting state, but that the input voltage VIN at the input terminal 11 is a negative voltage representing a binary "0". FIG. 6 is a graph which corresponds to this operational condition. Since the voltage at the input terminal 11 is a negative voltage, it will cause a current flow through the RTD 21 in a direction opposite to the constant current flow from the FET 31. Thus, the amount of current flowing the RTD 21 would be less than would be the case if the input voltage was zero. Consequently, with reference to FIG. 6, the load lines 61 and 81 will intersect the curve 50 at a point 121 which is shifted downwardly along the curve 50 from the point 72, to reflect a lower level of net current flow through the RTD 21.

When the FET 33 is then turned off and changes from its conducting state to its non-conducting state, the transition occurs at 83 from the load line 81 to the load line 61. During this transition, there will be a point in time where there is an effective load line 26 which intersects the curve 50 at the point 121 within the region 57, and also at a point 127 which is just within the region 56. At this time, the load line 126 does not intersect the curve 50 at any point within the region 58. Consequently, at this point in time, it is possible for the RTD 21 to transition from operation at the point 121 within the region 57 to operation at the point 127 within the region 56. However, the RTD 21 cannot transition from the point 121 to any point within the region 58. The RTD 21 will therefore transition from point 121 to point 126.

As the load line then completes its transition 83 from 81 to 61, the operation of the RTD 21 will transition downwardly along the curve 50 from the point 127 to a point 128. The point 128 corresponds to a voltage V0, which represents a binary "0" state of the latch circuit 10. Since the point 128 represents a condition of stable operation, the latch circuit 10 will remain latched in this particular operating state until the clock signal CLK again turns on the FET 33 in order to force the RTD 21 back to operation within the region 57, which is the reset state of the latch circuit 10.

After each clock transition which turns off the FET 33, the circuit 10 achieves a stable persistent output state indicating the polarity of the input VIN at the moment of the clock transition. Thus, the circuit 10 serves as a latching comparator. The value of the input VIN can be one of two specific voltage values which respectively represent a binary "1" or "0", and in this case the circuit 10 can be referred to as a digital binary latch. Alternatively, however, it is possible for the input VIN to have any positive or negative value across a wide range of voltages, and in this case the circuit 10 can be referred to as an analog latching comparator or digitizer. But in either case, the operation of the circuit 10 is essentially the same. In particular, each time the clock turns off the FET 33, the circuit 10 will end up producing one of two stable persistent output states, in dependence on the polarity of the input VIN at the time of the clock transition.

Figure 7:
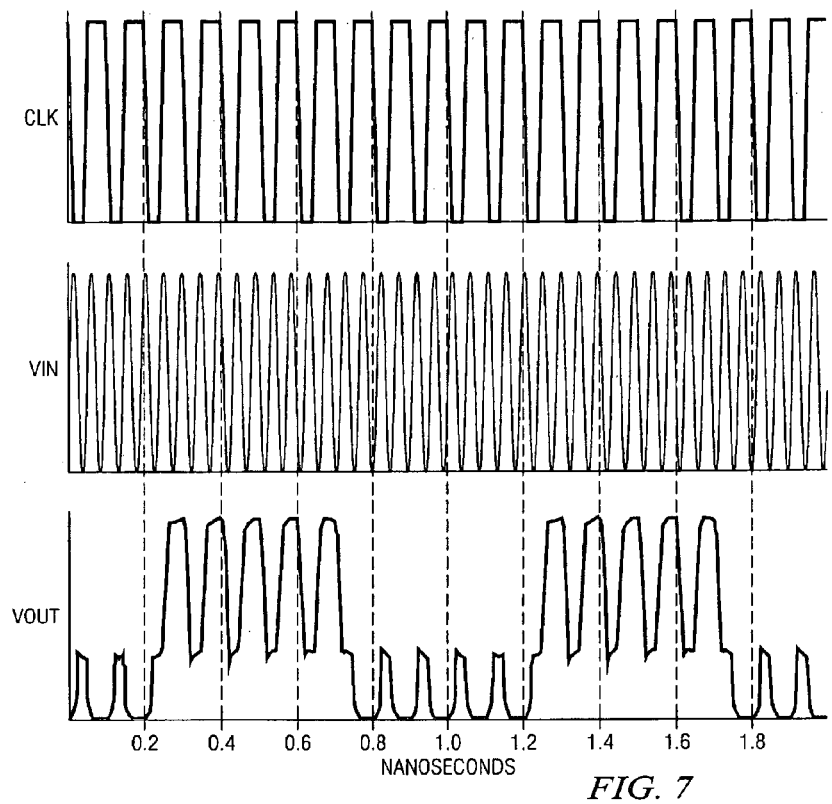
FIG. 7 is a graph showing one specific example of a clock signal and an input voltage for the latch circuit of FIG. 1, and the resulting output voltage.

FIG. 7 is a graph showing one example of the clock signal CLK, one example of the input voltage VIN, and the resulting output voltage VOUT. In this particular example, the input signal VIN is approximately a sine wave with a peak-to-peak amplitude of 2 mV and a frequency of 21 GHz, and the clock signal CLK causes sampling, to occur at a frequency of 10 GHz. Of course, the graph of FIG. 7 is merely one example of these signals. The circuit 10 is capable of properly sampling and digitizing signals at frequencies up to at least 330 GHz using typical and well-known FET and RTD devices.

Figure 8:
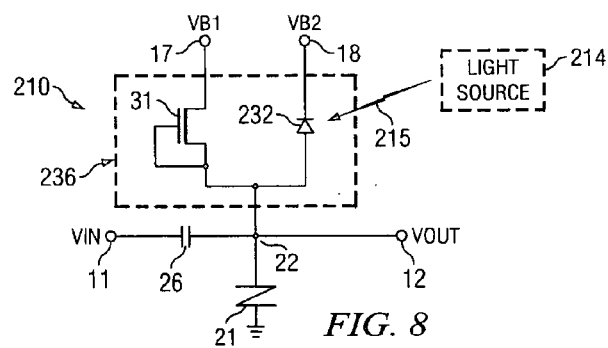
FIG. 8 is a schematic circuit diagram of an apparatus that includes a light source and a latch circuit, the latch circuit being an alternative embodiment of the latch circuit of FIG. 1.

FIG. 8 is a schematic circuit diagram of an apparatus which includes a latch circuit 210 and a light source 214. The light source 214 is a periodic pulsed laser of a type known in the art, such as a mode-locked laser or a fiber-ring laser. The light source 214 outputs a varying optical signal 215, which serves as a clock signal that varies in a periodic manner.

The latch circuit 210 is an alternative embodiment of the latch circuit 10 of FIG. 1. Equivalent parts are identified by the same reference numerals, and the following discussion focuses on the differences. In this regard, the only significant difference between the latch circuit 10 of FIG. 1 and the latch circuit 210 of FIG. 8 is that the FET 33 in FIG. 1 has been replaced with a photodiode 232 in FIG. 8. The photodiode 232 is responsive to the optical clock signal 215 for changing between a non-conductive state with a high resistance and a conductive state with a low resistance. The operation of the latch circuit 210 of FIG. 8 is very similar to the operation of the latch circuit 10 of FIG. 1, it is therefore not described here in detail.

The laser in the light source 214 can produce the optical signal 215 in the form of a 40 GHz pulse train with pulse widths of less than a few picoseconds. Thus, precise timing and high sample rates can be achieved. Further, the optical signal 215 does not inject any electrical current into the latch circuit 210, thus preventing the latch circuit 210 from being adversely influenced by any extraneous current derived from the clock signal. This avoids the phenomenon commonly known "clock current injection", which becomes progressively more problematic as the operational frequency is progressively increased.

The peak optical signal intensity provided by the light source 214 must be sufficient to cause the photodiode 232 to conduct enough photocurrent so that the effective load line provided to the RTD by the bias circuit 236 is similar to that shown at 81. That is, the photodiode conductance during the reception of the optical clock energy must be greater than the magnitude of the negative conductance of the RTD 21 at the equilibrium bias point. This is needed so that the RTD 21 can be placed in a known reset state within its region of negative resistance. The minimum optical signal intensity provided by the light source 214 must be low enough so that the RTD 21 is allowed to spontaneously transition to one of its stable operating points in its region of positive resistance.

The present invention provides a number of advantages. One such advantage results from the provision of a latching comparator circuit which uses only a single resonant tunneling diode. This provides frequency bandwidth and sample rates comparable or better than those in pre-existing devices that use two resonant tunneling diodes, and avoids the need for precise control of the amplitude and phase of two complementary clock signals. Bias sensitivity is greatly reduced, because the circuit is relatively insensitive to bias variations so long as the resonant tunneling diode is biased within its negative differential resistance region when the clock signal releases the latch circuit from its reset state.

Another advantage is that a wide instantaneous bandwidth is achieved, because the switching action begins in the fastest bias region of the negative differential resistance region. Stated differently, the large signal slew rate of a resonant tunneling diode in its negative differential resistance region is on the order of one volt per picosecond, which is at least ten times faster than the fastest transistor yet demonstrated, and twenty times faster than the fastest transistor constructed by ordinary wafer processing. Consequently, it is possible for the instantaneous bandwidth to be 200 GHz or higher. For example, an output swing of 400 mV can be obtained with an input sensitivity of less than 1 mV over a bandwidth of 200 GHz.

Further, the invention provides reduced jitter, because the quantizing action begins in the negative differential resistance region of the resonant tunneling diode, where there is a very high gain. Because the quantization process begins from within the negative resistance operating region of the RTD, the input signal is strongly amplified by the RTD at the same moment that the reset signal is removed. This allows the aperture time, during which the circuit decides its final output state, to be very low.

Unlike pre-existing approaches that use two resonant tunneling diodes, the invention biases a single resonant tunneling diode into its negative differential resistance region, which causes the input signal to actually to be amplified during sampling, which in turn allows gain to be traded for speed. The gain-bandwidth product of a resonant tunneling diode in its negative differential resistance region can be high as 2000 GHz. Thus, a 10 GSps quantizer can be constructed with an input voltage gain of roughly 20 dB. In some applications, this gain may reduce circuit complexity, for example by permitting the omission of one or more separate low noise preamplifiers.

Although selected embodiments have been illustrated and described in detail, it will be understood that various substitutions and alterations can be made without departing from the scope of the present invention. As one aspect of this, the disclosed embodiments use either a field effect transistor or a photodiode as a variable resistance device, but it would be possible to alternatively use any other suitable type of variable-resistance device. Further, a variety of other substitutions and alternation are possible without departing from the spirit and scope of the present invention, as defined by the following claims.

What is claimed is:

1. An apparatus comprising a quantizer circuit which includes:
   a resonant tunneling device having two ends, and having an operational characteristic which includes a first region of unstable operation and second and third regions of stable operation;
   an input terminal coupled to one of said ends of said resonant tunneling device;
   an output terminal coupled to said one end of said resonant tunneling device;
   a bias section coupled to said resonant tunneling device and having first and second operational modes is which are mutually exclusive, said bias section being responsive to a clock signal for operating selectively in each of said first and second operational modes in an alternating manner, wherein in said first operational mode said bias section forces said resonant tunneling device to operate within said first region, and wherein in said second operational mode said bias section permits said resonant tunneling device to operate in either of said second and third regions.

2. An apparatus according to claim 1, wherein said quantizer circuit is a latch circuit.

3. An apparatus according to claim 1, wherein said resonant tunneling device is a resonant tunneling diode.

4. An apparatus according to claim 3, wherein said second and third regions of said resonant tunneling diode are spaced regions of positive differential resistance in a current-to-voltage characteristic thereof, and said first region is a region of negative differential resistance disposed between said second and third regions.

5. An apparatus according to claim 3, wherein said bias section includes a constant current portion coupled to said one end of said resonant tunneling diode, and includes a further portion coupled between a source of power and said one end of said resonant tunneling diode, said further portion being responsive to said clock signal for switching between first and second states in which said further portion has significantly different degrees of conductivity, said first and second states respectively corresponding to said first and second operational modes.

6. An apparatus according to claim 5, wherein said constant current portion includes a field effect transistor coupled between a source of power and said one end of said resonant tunneling diode, with the gate of said field effect transistor coupled to one of the source and drain thereof.

7. An apparatus according to claim 5, wherein said further portion includes a field effect transistor coupled between said source of power and said one end of said resonant tunneling diode, said clock signal being applied to the gate of said field effect transistor.

8. An apparatus according to claim 5,
   wherein said clock signal is an optical clock signal in the form of varying photonic energy; and
   wherein said further portion includes a photosensitive device which is responsive to said optical clock signal and which is coupled between said source of power and said one end of said resonant tunneling diode.

9. An apparatus according to claim 8, wherein said photosensitive device is a photodiode.

10. An apparatus according to claim 5, including a capacitor coupled between said input terminal and said one end of said resonant tunneling diode.

11. A method of operating a quantizer circuit which includes a resonant tunneling device with two ends and an operational characteristic, and an input terminal and an output terminal which are each coupled to one of said ends of said resonant tunneling device, comprising:

selectively biasing said resonant tunneling device to operate in a first operational mode in which said resonant tunneling device is forced to operate within a first region of said operational characteristic thereof involving unstable operation;

selectively biasing said resonant tunneling device to operate in a second operational mode mutually exclusive from said first operational mode, in which said resonant tunneling device is permitted to operate in either of second and third regions of said operational characteristic which each involve stable operation; and responding to a clock signal by selectively operating said resonant tunneling device in said first and second operational modes in an alternating manner.

12. A method according to claim 11, including configuring said quantizer circuit to be a latch circuit.

13. A method according to claim 11, including selecting a resonant tunneling diode as said resonant tunneling device.

14. A method according to claim 13, including selecting said second and third regions to be spaced regions of positive differential resistance in a current-to-voltage characteristic of said resonant tunneling diode, and selecting said first region to be a region of negative differential resistance disposed between said second and third regions.

* * * * *